(12) United States Patent
Nakamichi et al.

(10) Patent No.: US 6,444,141 B2
(45) Date of Patent: Sep. 3, 2002

(54) PIEZOELECTRIC CERAMIC AND MANUFACTURING METHOD THEREFOR

(75) Inventors: Akihiro Nakamichi, Omihachiman; Koichi Hayashi, Kusatsu; Akira Ando, Omihachiman, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/773,398

(22) Filed: Jan. 31, 2001

(30) Foreign Application Priority Data

Jan. 31, 2000 (JP) ........................................ 2000-021499

(51) Int. Cl.$^7$ ................................................ H01L 41/18
(52) U.S. Cl. .................. 252/62.9 R; 501/134
(58) Field of Search ...................... 252/62.9 R; 501/134

(56) References Cited

FOREIGN PATENT DOCUMENTS

JP    57-47768    *  3/1982

* cited by examiner

*Primary Examiner*—C. Melissa Koslow
(74) *Attorney, Agent, or Firm*—Ostrolenk, Faber, Gerb & Soffen, LLP

(57) ABSTRACT

A piezoelectric ceramic for producing a piezoelectric element having sufficient strength and hardness in spite of compactness is provided. The piezoelectric ceramic contains lead titanate as a primary component and about 0.1 to 5% by weight of tungsten in terms of $WO_3$ relative to the primary component, and about 75% or more of crystal particles constituting the piezoelectric ceramic have particle diameters distributed in the range of about 0.2 μm to 0.8 μm.

14 Claims, 2 Drawing Sheets

PIEZOELECTRIC CERAMIC AND MANUFACTURING METHOD THEREFOR

BACKGROUND OF THE INVENTION

1. Field of the Invention

The present invention relates to a piezoelectric ceramic and a manufacturing method therefor. More specifically, the present invention relates to a piezoelectric ceramic used for, for example, a ceramic resonator, a ceramic filter, an ultrasonic resonator and an acceleration sensor, and to a manufacturing method therefor.

2. Description of the Related Art

Hitherto, PZT compositions containing $PbZrO_3$—$PbTiO_3$ as a primary component have been widely used as compositions for piezoelectric ceramics.

Addition of metallic oxides, such as $MnO_2$, and compound perovskite oxides, such as $Pb(Nb_{2/3}Mg_{1/3})O_3$, to the primary component or substitution for the aforementioned oxides have been attempted to improve piezoelectric characteristics.

The PZT piezoelectric ceramics were, however, not appropriate as materials of piezoelectric elements used, in particular, in high frequency regions because the PZT piezoelectric ceramics had high dielectric constants in spite of having superior piezoelectric characteristics. Most of conventional piezoelectric ceramics primarily including the PZT piezoelectric ceramics do not have very high mechanical strength and hardness as ceramic materials. In recent years, requirements for miniaturization of electronic parts have intensified, and piezoelectric ceramic elements are also required to be compact and to exhibit sufficient characteristics. In the case in which compact elements are used in environments where shocks and vibrations are likely to be encountered, there is a problem in reliability of strength. The reason for this is that accompanying the miniaturization of elements, the effect of heterogeneity in ceramic microstructure increases so as to decrease the strength of the element as a whole.

Therefore, for the uses in high frequency regions, PT piezoelectric ceramics containing $PbTiO_3$ as a primary component have been used. The PT piezoelectric ceramics have the merits of having low dielectric constants, of being superior in response in high frequency regions, and, in addition, of exhibiting high strength compared to the PZT piezoelectric ceramics.

Accompanying substantial miniaturization of elements, however, in accordance with strong market requirements for compact and thin layer elements, even the PT piezoelectric ceramics are insufficient in their strength.

SUMMARY OF THE INVENTION

Accordingly, objects of the present invention are to provide a piezoelectric ceramic having increased mechanical strength and which may be used for producing a piezoelectric element having sufficient strength and hardness in spite of compactness, and to provide a manufacturing method therefor.

A piezoelectric ceramic according to the present invention contains lead titanate as a primary component and about 0.1 to 5% by weight of tungsten in terms of $WO_3$ relative to the primary component, in which about 75% or more of the crystal particles constituting the piezoelectric ceramic have particle diameters distributed in the range of about 0.2 $\mu$m to 0.8 $\mu$m.

A piezoelectric ceramic according to the present invention may further contain about 2% or less by weight of silicon oxide in terms of $SiO_2$ relative to the primary component.

A manufacturing method for a piezoelectric ceramic according to the present invention includes a step of firing a piezoelectric ceramic material at a temperature of more than about 1,080° C. and less than about 1,150° C., in which the piezoelectric ceramic material contains lead titanate as a primary component and about 0.1 to 5% by weight of tungsten in terms of $WO_3$ relative to the primary component.

A manufacturing method for a piezoelectric ceramic according to the present invention includes the aforementioned step of firing, in which the piezoelectric ceramic material may further contain about 2% or less by weight of silicon oxide in terms of $SiO_2$ relative to said primary component.

It was discovered that in a piezoelectric ceramic containing lead titanate as a primary component and about 0.1 to 5% by weight of tungsten in terms of $WO_3$ relative to the primary component, when the diameters of the crystal particles were distributed in the range of about 0.2 $\mu$m to 0.8 $\mu$m and were not too small, the ceramic had increased strength, and the Vickers hardness thereof was increased by limiting the diameters of crystal particles to about 0.8 $\mu$m or less.

In a piezoelectric ceramic containing lead titanate as a primary component, when the piezoelectric ceramic contains less than about 0.1% by weight of tungsten in terms of $WO_3$ relative to the primary component, an effect as a sintering promoter cannot be seen, and the piezoelectric ceramic cannot be sintered at a low temperature. When the content exceeds about 5% by weight, the three-point flexural strength and Vickers hardness are decreased. Therefore, neither of the aforementioned cases is preferable.

It was discovered that a piezoelectric ceramic containing lead titanate as a primary component and about 0.1 to 5% by weight of tungsten in terms of $WO_3$ relative to the primary component, in which about 75% or more of crystal particles constituting the piezoelectric ceramic had particle diameters distributed in the range of about 0.2 $\mu$m to 0.8 $\mu$m, could be produced by firing a piezoelectric ceramic material containing lead titanate as a primary component and about 0.1 to 5% by weight of tungsten in terms of $WO_3$ relative to the primary component at a temperature of more than about 1,080° C. and less than about 1,150° C.. Herein, when the firing temperature is 1,080° C. or less, sintering does not sufficiently proceed, and when the firing temperature is 1,150° C. or more, growth of particles cannot be sufficiently suppressed. Therefore, neither of the aforementioned cases is preferable.

Furthermore, in the piezoelectric ceramic containing lead titanate as a primary component according to the present invention and in the manufacturing method therefor, by further containing about 2% or less by weight of silicon oxide in terms of $SiO_2$ relative to the primary component, the distribution of the diameters of crystal particles can be controlled.

The aforementioned objects, further objects, features, and advantages of the present invention will be apparent from the following detailed explanations of embodiments according to the present invention with reference to the drawings.

DESCRIPTION OF THE PREFERRED EMBODIMENTS

Figure 1:
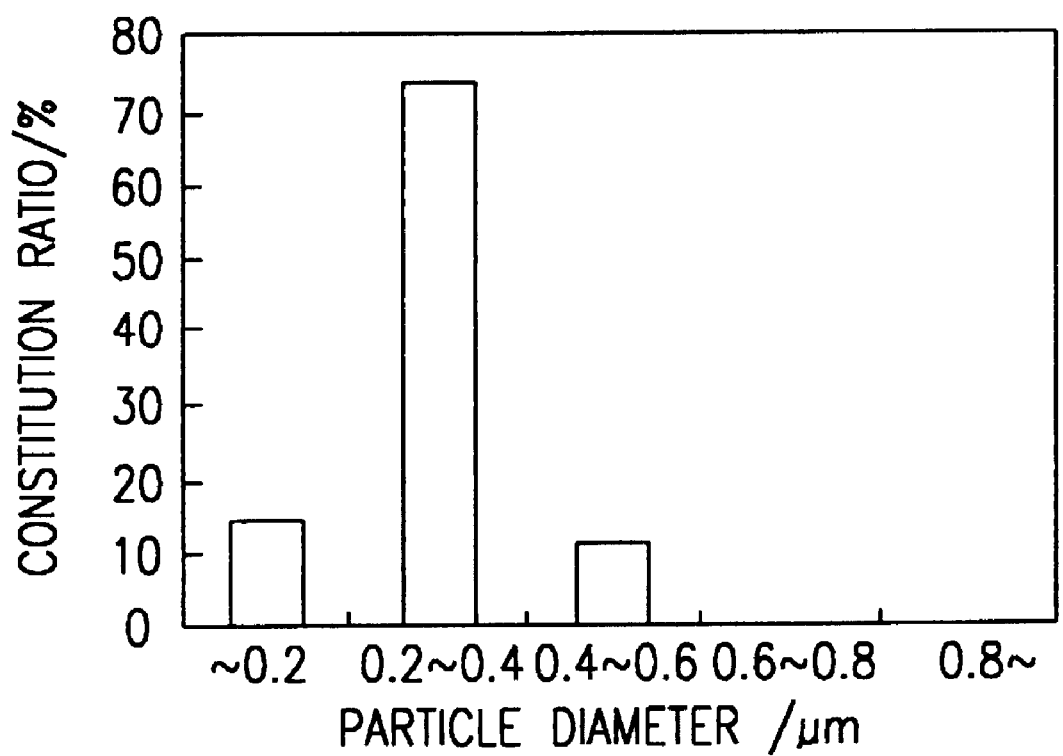
FIG. 1 is a graph showing the distribution of the diameters of crystal particles of Sample A.

The present invention relates to a piezoelectric ceramic containing lead titanate as a primary component. As examples of the piezoelectric ceramic containing lead titanate as a primary component, $(Pb_{0.865}La_{0.09})TiMn_{0.016}O_3$, etc., may be mentioned. In order to produce such a piezoelectric ceramic, for example, PbO, $TiO_2$, $La_2O_3$ and $MnCO_3$ are prepared as starting materials. These materials are weighed, mixed, calcined and pulverized. The resulting pulverized materials are fired after addition of, for example, 0.6% by weight of $WO_3$ and 0.3% by weight of $SiO_2$ as promoters, so as to produce a piezoelectric ceramic. Sintering at a low temperature become possible and growth of particles can be suppressed by controlling the additive amounts of the sintering promoters. Furthermore, the degree of the growth of the particles can be adjusted at a predetermined level by controlling the firing temperature.

The aforementioned piezoelectric ceramic is controlled so that about 75% or more of crystal particles thereof have particle diameters distributed in the range of about 0.2 μm to 0.8 μm. The distribution of diameters of crystal particles is determined by image analysis of a SEM image. In order to increase mechanical strength of the piezoelectric ceramic, it is preferable that most diameters of crystal particles be distributed in the range about 1 μm or less. The reason for this is that diameters of crystal particles must be sufficiently small compared to size of an element so as to prevent stress from concentrating at physical defects in the surface of the element, which causes decrease in strength of the element. It is not preferable that the diameters of crystal particles be too small. The reason for this is that when the diameters of crystal particles are too small, toughness is decreased. In the present invention, it was discovered that a piezoelectric ceramic having sufficient strength and hardness in spite of compactness could be produced when the diameters of about 75% or more of crystal particles of the piezoelectric ceramic being distributed in the range of about 0.2 mm to 0.8 μm.

EXAMPLE 1

PbO, $TiO_2$, $La_2O_3$, and $MnCO_3$, as starting materials, were weighed and were mixed so as to have a compositional formula $(Pb_{0.865}La_{0.09})TiMn_{0.016}O_3$. This mixture was wet milled using a ball mill for 16 hours. The resulting mixture was dehydrated and dried. Thereafter, the dried mixture was calcined in air at a temperature of 850° C. for 2 hours. The calcined material was pulverized using the ball mill again. 0.6% by weight of $WO_3$ and 0.3% by weight of $SiO_2$ were added as sintering promoters to the resulting pulverized materials, and an organic binder, a dispersing agent, etc., were further blended so as to produce a slurry, and thereafter, green sheets were produced by the doctor blade method. Then, the green sheets having a size of 40 mm by 27 mm were stacked one on the other and were molded by thermocompression bonding so as to produce a compact 600 μm in thickness.

The resulting compact was fired in an oxygen atmosphere at 1,100° C. so as to produce Sample A. Another compact was produced using materials similar to those of Sample A, and in a manner similar to that of Sample A, and was fired in an oxygen atmosphere at 1,080° C. so as to produce Comparative Sample B. Another compact was produced using materials similar to those of Sample A without adding sintering promoters $WO_3$ and $SiO_2$ in the production of a slurry, and was fired in an oxygen atmosphere at 1,230° C. so as to produce Comparative Sample C.

Sample A, Comparative Sample B, and Comparative Sample C were cut to form rectangular plate test pieces of 5 mm by 30 mm, and three-point bending destructive tests were made using a strength tester. The three-point flexural strength of each Sample determined based on breaking load and test piece size is shown in Table 1. Rectangular plate test pieces having mirror-finished surfaces were prepared and the Vickers hardness thereof were measured using a Vickers hardness tester. The results thereof are shown in Table 1. In the measurements of strength and hardness, 100 test pieces of each Sample were examined.

TABLE 1

|  | Three-Point Flexural Strength (MPa) | Vickers Hardness |
| --- | --- | --- |
| Sample A | 2.06 | 710 |
| Comparative Sample B | 1.27 | 720 |
| Comparative Sample C | 1.57 | 510 |

As is clear from Table 1, the average strength of Sample A is about 1.6 times that of Comparative Sample B, and about 1.3 times that of Comparative Sample C. It is clear that the Vickers hardness of Sample A is higher than that of Comparative Sample C and is nearly equivalent to that of Comparative Sample B.

Figure 2:
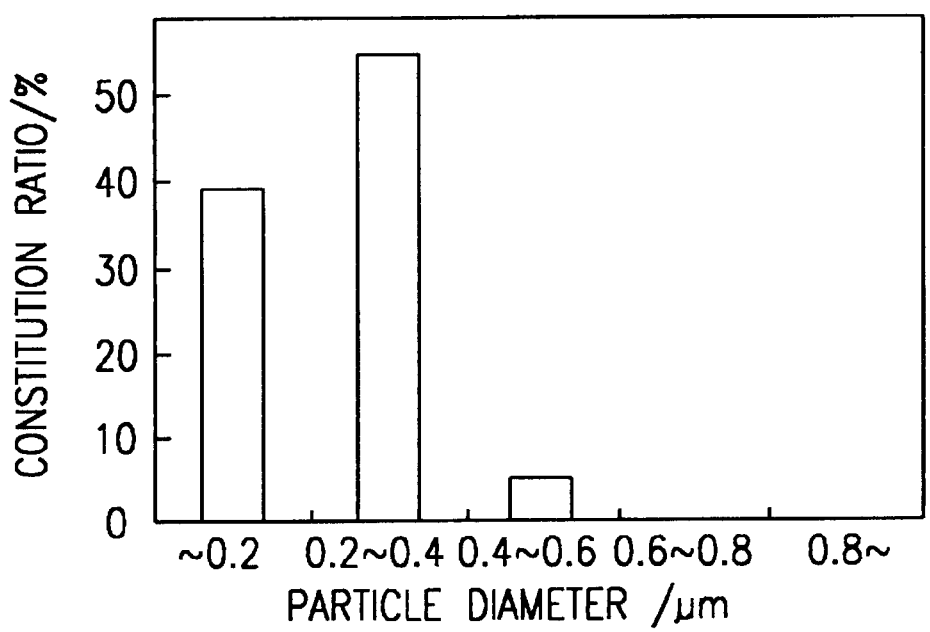
FIG. 2 is a graph showing the distribution of the diameters of crystal particles of Comparative Sample B.
Figure 3:
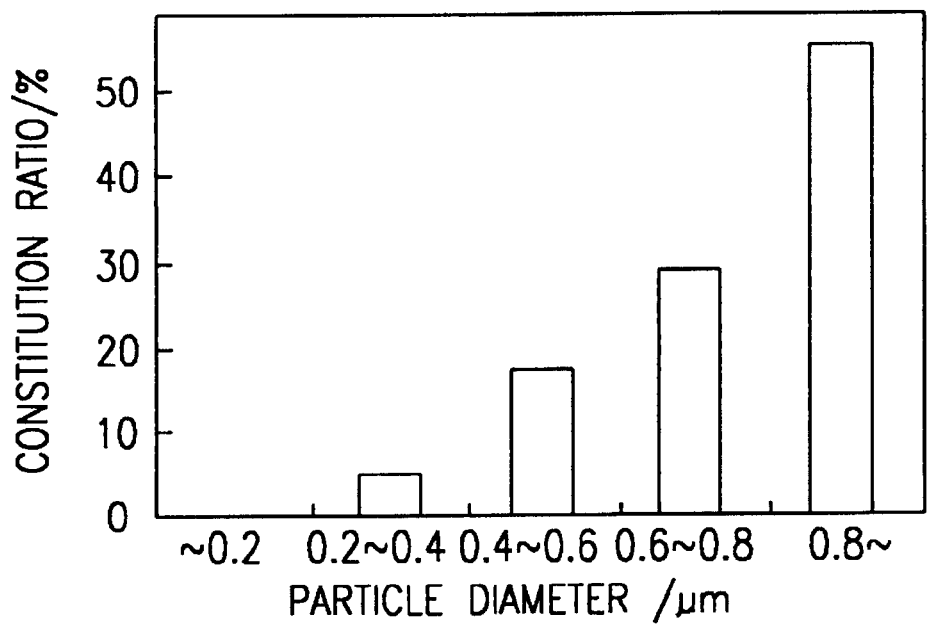
FIG. 3 is a graph showing the distribution of the diameters of crystal particles of Comparative Sample C.

SEM images of fractured surfaces of Sample A, Comparative Sample B, and Comparative Sample C were examined. Distributions of the particle diameters of the crystal particles determined by image analysis of these SEM images are shown in FIG. 1, FIG. 2 and FIG. 3, respectively.

As is clear from FIG. 1, 75% or more of crystal particles have particle diameters distributed in the range of about 0.2 μm to 0.8 μm in Sample A,. On the other hand, as is clear from FIG. 2, 25% or more of crystal particles having particle diameters less than 0.2 μm are observed in Comparative Sample B . As is clear from FIG. 3, 25% or more of crystal particles having a particle diameter exceeding 0.8 μm are observed in Comparative Sample C. In Comparative Sample B, however, sintering and growth of particles can also be accelerated by increasing an additive amount of $WO_3$ as a sintering promoter so as to produce samples having a predetermined distribution of particle diameters.

As is clear from the aforementioned results, about 75% or more of crystal particles have particle diameters distributed in the range of about 0.2 μm to 0.8 μm in Sample A, and therefore, Sample A exhibits superior mechanical characteristics, that is, the mechanical strength thereof is higher than that of Comparative Sample B in which diameters of crystal particles tend to be less than 0.2 μm, and the Vickers hardness of Sample A is higher than that of Comparative Sample C in which diameters of crystal particles tend to be more than 0.8 μm.

EXAMPLE 2

In Example 2, test pieces of Sample numbers 1 to 8 were prepared with variations in $WO_3$ content compared to Sample A in Example 1.

In a manner similar to that of Example 1, distributions of the particle diameters of the crystal particles, three-point flexural strength and Vickers hardness of test pieces of Sample numbers 1 to 8 were examined. The results thereof are shown in Table 2. In Table 2, the term "unsintered" in the column of Distribution of Diameters of Crystal Particles indicates that test pieces of Sample numbers 1 and 2 could not be sintered, and the term "within range" indicates that in test pieces of Sample numbers 3 to 8, 75% or more of crystal particles constituting the piezoelectric ceramic had particle diameters distributed in the range of about 0.2 μm to 0.8 μm.

TABLE 2

| Sample Number | Content of $WO_3$ (% by weight) | Distribution of Diameters of Crystal Particles | Three-Point Flexural Strength (MPa) | Vickers Hardness |
|---|---|---|---|---|
| 1 | 0.0 | unsintered | — | — |
| 2 | 0.05 | unsintered | — | — |
| 3 | 0.1 | within range | 1.86 | 710 |
| 4 | 1.0 | within range | 2.14 | 700 |
| 5 | 2.0 | within range | 2.08 | 720 |
| 6 | 4.0 | within range | 2.12 | 690 |
| 7 | 5.0 | within range | 2.02 | 600 |
| 8 | 5.5 | within range | 1.84 | 530 |

As is clear from Table 2, among piezoelectric ceramics containing lead titanate as a primary component in which about 75% or more of crystal particles constituting the piezoelectric ceramic have particle diameters distributed in the range of about 2 μm to 0.8 μm, the test pieces of Sample numbers 3 to 7 containing about 0.1 to 5% by weight of tungsten in terms of $WO_3$ relative to the primary component have high three-point flexural strength and Vickers hardness.

As is clear from Table 2, among piezoelectric ceramics containing lead titanate as a primary component, test pieces of Sample numbers 1 and 2 containing less than 0.1% by weight of tungsten in terms of $WO_3$ relative to the primary component, do not exhibit an effect of sintering promotion so that the test pieces cannot be sintered, and in test pieces of Sample number 8 containing tungsten exceeding about 5% by weight in terms of $WO_3$, the three-point flexural strength and Vickers hardness are decreased.

Even when materials other than the ceramic materials shown in the aforementioned Examples 1 and 2 are used, as long as the materials are piezoelectric ceramics containing lead titanate as a primary component and about 0.1 to 5% by weight of tungsten in terms of $WO_3$ relative to the primary component is used, by making the particle diameters of 75% or more of crystal particles distributed in the range of about 0.2 μm to 0.8 μm, piezoelectric ceramics having high mechanical strength and hardness can be produced. Furthermore, a piezoelectric ceramic having a low dielectric constant and exhibiting superior response in high frequency regions compared to the PZT piezoelectric ceramics can be produced.

According to the present invention, a piezoelectric ceramic having increased mechanical strength in spite of compactness, having a high Vickers hardness, having a low dielectric constant and exhibiting superior response in high frequency regions can be provided.

What is claimed is:

1. A piezoelectric ceramic comprising:

a primary component comprising lead titanate; and about 0.1 to 5% by weight of tungsten in terms of $WO_3$ relative to said primary component, wherein about 75% or more of crystal particles constituting said piezoelectric ceramic have particle diameters distributed in the range of about 0.2 μm to 0.8 μm.

2. A piezoelectric ceramic according to claim 1, further comprising about 2% or less by weight of silicon oxide in terms of $SiO_2$ relative to said primary component.

3. A piezoelectric ceramic according to claim 2, wherein said lead titanate contains La and Mn.

4. A piezoelectric ceramic according to claim 3, wherein the amount of tungsten in terms of $WO_3$ relative to said primary component is about 1 to 4% by weight.

5. A piezoelectric ceramic according to claim 1, wherein said lead titanate contains La and Mn.

6. A piezoelectric ceramic according to claim 5, wherein the amount of tungsten in terms of $WO_3$ relative to said primary component is about 1 to 4% by weight.

7. A piezoelectric ceramic according to claim 1, wherein the amount of tungsten in terms of $WO_3$ relative to said primary component is about 1 to 4% by weight.

8. A manufacturing method for a piezoelectric ceramic, comprising firing a piezoelectric ceramic material at a temperature of more than about 1,080° C. and less than about 1,150° C., wherein said piezoelectric ceramic material comprises:

a primary component comprising lead titanate; and about 0.1 to 5% by weight of tungsten in terms of $WO_3$ relative to said primary component.

9. A manufacturing method for a piezoelectric ceramic according to claim 8, wherein said piezoelectric ceramic material further comprises about 2% or less by weight of silicon oxide in terms of $SiO_2$ relative to said primary component.

10. A manufacturing method for a piezoelectric ceramic according to claim 9, wherein said lead titanate contains La and Mn.

11. A manufacturing method for a piezoelectric ceramic according to claim 10, wherein the amount of tungsten in terms Of $WO_3$ relative to said primary component is about 1 to 4% by weight.

12. A manufacturing method for a piezoelectric ceramic according to claim 8, wherein said lead titanate contains La and Mn.

13. A manufacturing method for a piezoelectric ceramic according to claim 12, wherein the amount of tungsten in terms of $WO_3$ relative to said primary component is about 1 to 4% by weight.

14. A manufacturing method for a piezoelectric ceramic according to claim 8, wherein the amount of tungsten in terms of $WO_3$ relative to said primary component is about 1 to 4% by weight.

* * * * *